US010270397B2

(12) United States Patent
Blednov (10) Patent No.: US 10,270,397 B2
(45) Date of Patent: Apr. 23, 2019

(54) AMPLIFIER DEVICES WITH INPUT LINE TERMINATION CIRCUITS

(71) Applicant: NXP USA, Inc., Austin, TX (US)

(72) Inventor: Igor Blednov, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/698,916

(22) Filed: Sep. 8, 2017

(65) Prior Publication Data

US 2018/0115284 A1    Apr. 26, 2018

(30) Foreign Application Priority Data

Oct. 24, 2016 (EP) .................................... 16306391

(51) Int. Cl.
| | |
|---|---|
| *H03F 1/07* | (2006.01) |
| *H03F 1/02* | (2006.01) |
| *H03F 1/56* | (2006.01) |
| *H03F 3/19* | (2006.01) |
| *H03F 3/62* | (2006.01) |
| *H03F 1/32* | (2006.01) |
| *H03F 3/24* | (2006.01) |
| *H03F 3/60* | (2006.01) |

(52) U.S. Cl.
CPC ......... *H03F 1/0288* (2013.01); *H03F 1/0205* (2013.01); *H03F 1/32* (2013.01); *H03F 1/56* (2013.01); *H03F 3/19* (2013.01); *H03F 3/245* (2013.01); *H03F 3/605* (2013.01); *H03F 3/62* (2013.01); *H03F 2200/222* (2013.01); *H03F 2200/451* (2013.01)

(58) Field of Classification Search
CPC ................................ H03F 1/07; H03F 1/0288

USPC ............................................. 330/295, 124 R
See application file for complete search history.

(56) References Cited

U.S. PATENT DOCUMENTS

| | | |
|---|---|---|
| 5,532,636 A | 7/1996 | Mar et al. |
| 6,288,660 B1 | 9/2001 | Nisbet |
| | (Continued) | |

FOREIGN PATENT DOCUMENTS

| | | |
|---|---|---|
| EP | 1 870 716 A | 12/2007 |
| GB | 2 333 915 A | 8/1999 |
| | (Continued) | |

OTHER PUBLICATIONS

Chen, W. et al. "A Concurrent Dual-Band Uneven Doherty Power Amplifier with Frequency-Dependent Input Power Division", IEEE Transactions on Circuits and Systems I: Regular Papers, vol. 61, No. 2, pp. 552-561 (Feb. 2014).

(Continued)

*Primary Examiner* — Henry Choe (57) ABSTRACT

The embodiments described herein provide wideband highly asymmetrical power efficient amplifier device that include a compact input power distribution network with input termination circuit. The input termination circuit is configured to provide control of the power distribution at the amplifier input. In one embodiment, the input termination circuit is configured to generate and reflect a frequency dependent portion of an input signal back toward the amplifier device inputs. This input reflection controls the input power distribution and shape of time domain input signal in a way that can affect amplifier device efficiency and linearity.

10 Claims, 8 Drawing Sheets

(56) References Cited

U.S. PATENT DOCUMENTS

| | | | |
|---|---|---|---|
| 7,061,314 B2* | 6/2006 | Kwon | H03F 1/0205 |
| | | | 330/124 R |
| 7,078,976 B2 | 7/2006 | Blednov | |
| 7,358,807 B2 | 4/2008 | Scuderi et al. | |
| 7,602,255 B1 | 10/2009 | Lai et al. | |
| 7,884,668 B2 | 2/2011 | Blednov | |
| 7,898,388 B2 | 3/2011 | Ehrman et al. | |
| 8,022,739 B2 | 9/2011 | Yan | |
| 8,160,121 B2 | 4/2012 | Forenza et al. | |
| 8,396,368 B2 | 3/2013 | Tarlazzi et al. | |
| 8,487,703 B2 | 7/2013 | Blednov | |
| 8,664,973 B2* | 3/2014 | Ali | H04L 25/0278 |
| | | | 326/30 |
| 8,717,099 B2 | 5/2014 | Wilson et al. | |
| 9,077,285 B2 | 7/2015 | Holmes | |
| 9,325,324 B1 | 4/2016 | Gupta et al. | |
| 9,484,865 B2* | 11/2016 | Kobayashi | H03F 1/0288 |
| 9,628,093 B2 | 4/2017 | Goumballa et al. | |
| 2002/0021116 A1 | 2/2002 | Sirito-Olivier | |
| 2005/0231286 A1* | 10/2005 | Gotou | H03F 1/0288 |
| | | | 330/295 |
| 2006/0071716 A1 | 4/2006 | Fang et al. | |
| 2008/0018396 A1 | 1/2008 | Mallet-Guy et al. | |
| 2009/0179702 A1* | 7/2009 | Blednov | H03F 1/0288 |
| | | | 330/277 |
| 2010/0176885 A1 | 7/2010 | Kim et al. | |
| 2010/0237944 A1 | 9/2010 | Pierdomenico | |
| 2011/0164526 A1 | 7/2011 | Zhu et al. | |
| 2012/0218026 A1 | 8/2012 | Nadimpalli et al. | |
| 2012/0294162 A1 | 11/2012 | Pajukoski et al. | |
| 2012/0327800 A1 | 12/2012 | Kim et al. | |
| 2013/0029619 A1* | 1/2013 | Zhang | H03F 1/3205 |
| | | | 455/127.2 |
| 2013/0241639 A1 | 9/2013 | Wilson et al. | |
| 2014/0011535 A1 | 1/2014 | Jeon | |
| 2014/0064394 A1 | 3/2014 | Wang et al. | |
| 2014/0274085 A1 | 9/2014 | Kwak et al. | |
| 2014/0341144 A1 | 11/2014 | Zhang et al. | |
| 2015/0145601 A1* | 5/2015 | Moronval | H03F 3/211 |
| | | | 330/295 |
| 2015/0326296 A1 | 11/2015 | Thiele et al. | |
| 2015/0341814 A1 | 11/2015 | Yu et al. | |
| 2016/0315674 A1 | 10/2016 | Li et al. | |
| 2017/0126181 A1* | 5/2017 | Embar | H03F 1/0288 |
| 2017/0187504 A1 | 6/2017 | Qian et al. | |
| 2017/0201340 A1 | 7/2017 | Yum et al. | |
| 2018/0131329 A1* | 5/2018 | Tong | H03F 1/0288 |

FOREIGN PATENT DOCUMENTS

| | | |
|---|---|---|
| WO | 2014/068351 A2 | 5/2014 |
| WO | 2015/008108 A1 | 1/2015 |
| WO | 2015/145601 A1 | 10/2015 |

OTHER PUBLICATIONS

Nghiem, X. A. et al. "Design of a broadband three-way sequential Doherty power amplifier for modern wireless commmunications", IEEE MTT-S International Microwave Symposium, 4 pgs. (2014).

U.S. Appl. No. 14/707,179, "Charge Pump Apparatus, Phase-locked Loop, and Method of Operating a Charge Pump Apparatus", filed May 19, 2015, pp. 1-26.

U.S. Appl. No. 15/616,125, "Method and Apparatus for Generating a Charge Pump Control Signal", filed Jun. 7, 2016, pp. 1-18.

Notice of Allowance dated Oct. 30, 2017 for U.S. Appl. No. 14/707,179 7 pages.

Non Final Office Action dated May 25, 2017 for U.S. Appl. No. 14/707,179, 10 pages.

U.S. Appl. No. 15/299,041, "Method and Apparatus for Performing Distributed Computation of Precoding Estimates", filed Oct. 20, 2016, pp. 1-24.

* cited by examiner

AMPLIFIER DEVICES WITH INPUT LINE TERMINATION CIRCUITS

RELATED APPLICATION

This application claims priority to European patent application 16306391.1, filed on Oct. 24, 2016.

TECHNICAL FIELD

Embodiments of the subject matter described herein relate generally to amplifiers, and more particularly to wideband radio frequency (RF) power efficient and linear amplifiers used in a variety of applications.

BACKGROUND

In general, amplifiers are used to increase the power of signals. For example, amplifiers can be used to convert low-power radio frequency (RF) signals into larger RF signals for driving the antenna of a transmitter. In such cases, amplifiers may be implemented as part of overall power amplifier used by an RF transmission system.

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase.

Another important amplifier parameter is linearity. In general, amplifier linearity is a measurement of how accurate the output signal is compared to the input signal applied to the input of the amplifier, particularly when generating high power. Unfortunately, many amplifier designs with high theoretical power efficiencies like, for example, widely used Doherty amplifiers, have relatively poor linearity. Therefore, there remains a need for amplifiers that provide both relatively high efficiency and relatively high linearity, particularity for high power RF applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein relate generally to semiconductor devices, and relate more particularly to amplifiers devices, including amplifier devices for wideband, high power, radio frequency (RF) applications. In general, the embodiments described herein provide amplifier devices that include an input termination circuit configured to provide improved control of the power distribution at the amplifier input.

In one embodiment, the input termination circuit is configured to reflect a frequency dependent portion of an input signal back toward the amplifier input. This input reflection can provide improved control over the input power distribution in a way that can increase the linearity of the amplifier device. Furthermore, such an increase in linearity can be provided to amplifier devices that are used in wideband, high power RF applications. As will be described in greater detail below, these input termination circuits can be implemented with a variety of circuits, including nonlinear and controllable impedances. Furthermore, such controllable impedances can be adapted to be variable responsive to input voltages, currents, and frequencies applied to the amplifier device.

The embodiments described herein are particularly applicable to multi-way Doherty amplifier technology. In general, Doherty-type amplifier devices use a carrier amplifier and one or more peaking amplifiers coupled in parallel to provide parallel amplification paths. These Doherty-type amplifiers are particularly applicable to high power RF applications, where amplification of amplitude modulated signals with high crest factor can require maintaining high power efficiency and linearity. When a Doherty-type amplifier is implemented to include an input termination circuit, an input reflection generated by the input termination circuit can provide improved control over the input power distribution to the multiple amplifiers, and this improved control can improve amplifier linearity in the multiple amplifiers. As a specific example, in Doherty amplifier devices non-linearity can arise due to parameter spread between the amplifiers, for example, due to differences in input impedance, threshold voltage, or peak drain current capability in multiple combined peaking amplifiers. The embodiments described herein can increase the linearity of such Doherty amplifier devices by using the input termination circuit to provide equal or another appropriate unequal input drive over the power and frequency range, or over an output current amplitude and phase range. In either case, the input termination circuit can facilitate optimal output power combine conditions in the N-way Doherty-type amplifier.

Figure 1:
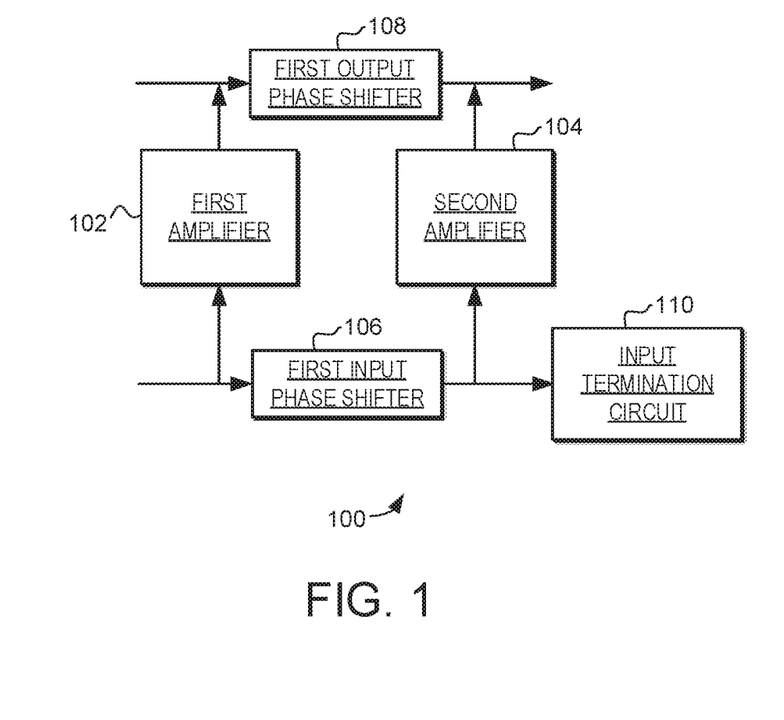
FIG. 1 is a schematic diagram of a portion of an amplifier in accordance with an example embodiment.

Turning now to FIG. 1, a schematic diagram of a portion of an exemplary amplifier device 100 is illustrated. The amplifier device 100 includes a first amplifier 102 (including one or more first transistors), a second amplifier 104 (including one or more second transistors), a first input phase shifter 106, a first output phase shifter 108, and an input termination circuit 110. It should be noted that amplifier device 100 is a simplified representation of a portion of an amplifier, and in a more typical implementation the amplifier would include additional features not illustrated in FIG. 1. Examples of such features include input drivers, matching networks, etc. Also, as will be described above, in various embodiments the amplifier device 100 could be implemented as part of a Doherty amplifier, but other implementations are also provided.

The first amplifier 102 includes a first amplifier input and a first amplifier output. Likewise, the second amplifier 104 includes a second amplifier input and a second amplifier output. The first input phase shifter 106 is coupled between the first amplifier input and the second amplifier input. Likewise, the first output phase shifter is coupled between the first amplifier output and the second amplifier output.

In general, the first input phase shifter 106 is configured to provide a phase shift to an input signal at an operational frequency of the amplifier device 100. As an example, the input phase shifter 106 can provide a phase shift of about 90 (plus or minus 5) degrees for Doherty operations. To facilitate this, the first input phase shifter 106 can be implemented with a variety of devices and structures. For example, the first input phase shifter 106 could be implemented with a transmission line, or with transmission line equivalent such as lumped or integrated element equivalents or combination of both distributed and lumped elements if appropriate.

As one specific example, the first input phase shifter 106 can be implemented with a specific characteristic impedance configured to provide about a 90 degree phase shift for signals at a fundamental frequency ($f_o$), and provide about a 180 degree phase shift for signals at a second harmonic frequency ($2f_o$) and provide signal rejection for signals at a third harmonic frequency ($3f_o$).

The first output phase shifter 108 is configured to provide a phase shift to an output signal of an operational frequency of the amplifier device 100. As an example, the output phase shifter 108 can provide a phase shift of about 90 (plus or minus 5) degrees for Doherty operations. To facilitate this, the first output phase shifter 108 can be implemented with a variety of devices and structures. For example, the first output phase shifter 108 could be also implemented with a transmission line, or with transmission line equivalent such as lumped or integrated element equivalents or combination of both distributed and lumped elements.

In accordance with the embodiments described herein, the input termination circuit 110 is coupled to the first input phase shifter 106 and the second amplifier 104, specifically, the second amplifier input. The input termination circuit 110 is configured to reflect a frequency dependent portion of the input signal back toward the amplifier input, specifically, back toward the first input phase shifter 106 and the second amplifier 104. The frequency dependency of the reflection is configured to provide improved control of the input power distribution over the operational frequency band. Furthermore, such a frequency dependent reflection can increase the linearity of the amplifier device 100, especially at the edges of the frequency band, where phase and amplitude of input signal is in general less optimal than in the center of the frequency band.

In general, the amplifier devices described herein include an input termination circuit configured to provide improved control of the power distribution with more optimal amplitudes and phase at the amplifier input. The input termination circuit 110 can be implemented with a variety of configurations and structures.

In one embodiment, the input termination circuit 110 includes a constant impedance component coupled to the input of the second amplifier 104. With a constant impedance component, the ratio of generated current to applied voltage at the termination circuit 110 does not change, either as a function of voltage, current or frequency. As such, a constant impedance can also be described as a linear impedance.

In another embodiment, the input termination circuit 110 includes a non-linear impedance component coupled to the input of the second amplifier 104. With a non-linear impedance component, the ratio of generated current to applied voltage at the termination circuit 110 changes over its operational range or in response to some other factor. For example, the non-linear impedance component can be variable responsive to changes in at least one of a voltage and current applied to the non-linear impedance component. In one embodiment, this non-linear impedance component is implemented with a transistor configured to operate in its linear and a non-linear VI region. In other embodiments, this non-linear impedance component is implemented with any combination of a non-linear components such as a diode, a varactor, a varistor, a Hall sensor, and metal-oxide-semiconductor (MOS) capacitor providing required response of impedance versus frequency and or power/RF voltage level.

Such non-linear impedance components, when implemented in the input termination circuit 101 can provide a source of higher order harmonic signals when certain frequency component voltages are applied to them. Specifically, depending on the mutual impedance of the non-linear component, certain harmonics of certain amplitudes can be generated and reflected back from the input termination circuit 101 and toward the input of the second amplifier 104. The reflection of such harmonics can be used to control the drive signal time domain shape at the input of the second amplifier 104 and first amplifier 102. This can improve efficiency, for example, by tailoring the input signal shape in the time domain, and thus providing an output/drain current pulse with a shape (e.g., rectangular) configured for the best inverted F-class amplifier operation.

As one specific example, a non-linear impedance component in the input termination circuit 110 can be used to generate and reflect harmonic signals, thus providing even order harmonics of the fundamental signal frequency ($f_o$) at the input of the second amplifier 104, and this can be used to provide F-class operation of amplifier 100. Furthermore, in such an embodiment the reflected signal can additionally travel back to the input of the first amplifier 102. For example, in the case of a transmission line input phase shifter with linear phase characteristic reflecting back to the input of the first amplifier 102, the reflected signal will travel twice the electrical length and as such will experience about a 180 degree phase shift. This effectively generates a repeat second harmonic signal at the input of the first amplifier 102 that is similar to that generated by non-linear termination connected at input of amplifier 104. This second harmonic signal, when combined with the first harmonic signal at the input of the second amplifier 104, may result in higher amplitude and narrowing of the input signal shape that represents a shorter conduction angle, and thus provide conditions for F-class operation mode with better amplifier power efficiency.

In another embodiment, the input termination circuit 110 includes a controllable impedance component coupled to the input of second amplifier 104. In these embodiments, the ratio of generated current to applied voltage at the termination circuit 110 changes in response to a control signal or other input. For example, the controllable impedance component can be adapted to be variable in response to an input received by the amplifier device 100. As a detailed example, the controllable impedance component can be adapted to be variable responsive to an input voltage applied to the amplifier device 100.

In other embodiments, the controllable impedance component can be adapted to be variable responsive to an input current applied to the amplifier device 100. In yet another embodiment, the controllable impedance component can be adapted to be variable responsive to the frequency of an input signal applied to the amplifier device 100.

These controllable impedance components can be implemented with a variety of devices and structures. For example, the controllable impedance component can be implemented with a controllable voltage limiter. When appropriately implemented with a voltage limiter, the input termination circuit 110 will generate and reflect multiple odd harmonic signals (e.g., $3f_0$, $5f_0$, etc.) of the fundamental signal frequency $f_0$. So configured, the odd harmonics generated at the input of the second amplifier 104 can be used to provide inverse F-class operation of amplifier 100. Specifically, the odd harmonics at proper phases at the inputs of the first amplifier 102 and second amplifier 104 tailor the time domain input signal to have a rectangular shape. This voltage shape provides a gate-source voltage and output current to the transistor(s) implementing the second amplifier 104 suitable for inverse F-class operation.

In each of these embodiments the controllable impedance component functions as part of the input termination circuit 110 to reflect a frequency dependent portion of the input signal back toward the amplifier input. This frequency dependent reflection is again configured to provide improved control over the input power distribution, and more specifically can provide improved linearity or/and efficiency in the output of the amplifier device 100.

In some embodiments the amplifier device 100 could be implemented as part of a Doherty amplifier. In such an embodiment the amplifier device would additionally comprise a carrier amplifier, and at least a second input phase shifter and a second output phase shifter. Details of exemplary Doherty amplifier embodiments will be discussed below with reference to FIG. 8.

Finally, in some embodiments an asymmetrical input splitter can be coupled to the input of the amplifier device 100. For example, a Wilkinson-type power splitter configured to provide asymmetrical input splitting can be coupled to the input of the amplifier device and provide a portion of the input signal to the first amplifier 102 input. Again, details of such an embodiment will be discussed below with reference to FIG. 9

Furthermore, such an increase in linearity can be provided to amplifier devices that are used in high power radio frequency (RF) applications. As will be described in greater detail below, the input termination circuits can be implemented with a variety of circuits, including nonlinear, controllable impedances. Such controllable impedances can be adapted to be variable responsive to input voltages, currents, and frequencies applied to the amplifier device.

Figure 2:
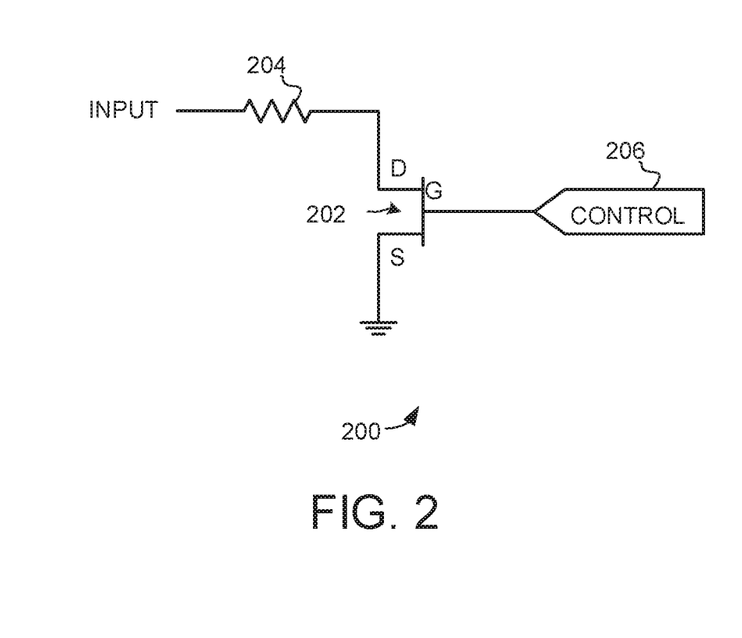
FIG. 2 is a circuit diagram of an exemplary input termination circuit in accordance with an example embodiment.

Turning now to FIG. 2, a first embodiment of an input termination circuit 200 is illustrated. The input termination circuit 200 includes an input (e.g., coupled to the output of first input phase shifter 106), a transistor 202 and a resistor 204. The transistor 202 is controlled using a control signal 206 applied to the gate (G). The drain (D) of the transistor 202 is coupled to the resistor 204, and the source (S) of the transistor 202 is coupled to a ground reference node. In this illustrated embodiment, the transistor 202 comprises an n-channel field effect transistor (FET), but that is just one example and other types of transistors can be used.

Figure 3:
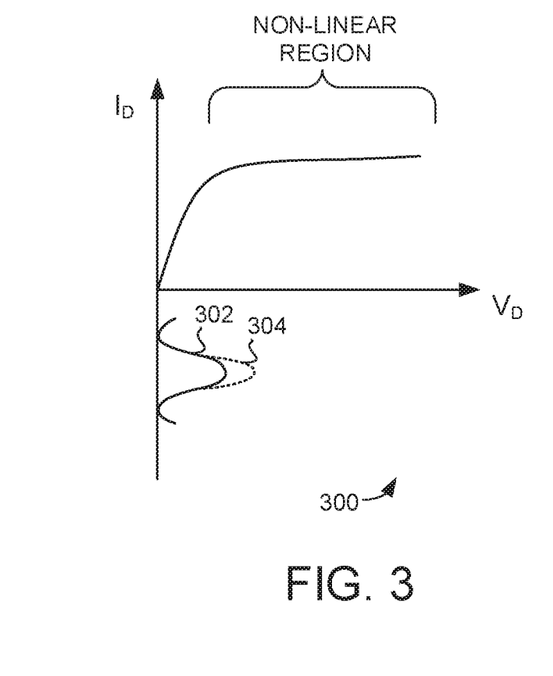
FIG. 3 is a graphical representation of drain-source voltage ($V_D$) and the drain source current ($I_D$) in an exemplary input termination circuit in accordance with an example embodiment.

The input termination circuit 200 can be configured to provide non-linear and/or controllable impedance to an amplifier device. For example, the control signal 206 applied to the gate of the transistor 202 can be selected such that the transistor 202 operates in a non-linear VI region. Turning to FIG. 3, a graph 300 illustrates exemplary relationship between the transistor 202 drain-source voltage ($V_D$) and the drain source current ($I_D$). Indicated in graph 300 is non-linear region, where the relationship between voltage and current is non-linear. Typically, this non-linear region corresponds to the saturation region of the transistor, although that is not always required. Thus, by applying an appropriate control signal 206 to the gate of transistor 202, the transistor 202 will operate in the non-linear VI region, and this will result in non-linear impedance being presented by the input termination circuit 200.

Also illustrated in FIG. 3 is an input signal 302. This input signal 302 is exemplary of the type of signal that would be applied to the input termination circuit 200 from the amplifier device (e.g., amplifier device 100). Specifically, the input signal 302 would be applied to input termination circuit 200 from the output of the first input phase shifter (e.g., first input phase shifter 106). When applied to the non-linear impedance presented by the input termination circuit 200, the input signal 302 is modified (i.e., rises and increases in amplitude in this example) as illustrated in modified signal 304. This modified signal 304 is reflected back toward the amplifier device, where it functions to facilitate improved control over the input power distribution in a way that can increase the linearity of the amplifier device.

This increase in amplitude in the modified signal 304 effectively results in an even harmonic signal (e.g., at the second harmonic frequency ($2f_0$)) being applied back to the amplifier input (e.g., the input of second amplifier 104). Again, such an embodiment can be used for F-class operation mode with improved efficiency. In such an embodiment, the transistor 202 exhibits relatively high impedance at signal amplitudes above a certain level. This can be seen in the graph 300, where the so called "triode" area of the IV characteristic reaches "knee voltage" and turns into the saturation area. In this saturation area, higher voltage applied to the transistor does not significantly change output current, and thus when so operating represents a high impedance state. Thus, when the transistor 202 is operated above this knee voltage, the input termination circuit 200 will reflect part of this portion of signal back to the input of amplifier, where the reflected signal may be represented by a set of even harmonics $2f_0$, $4f_0$, $6f_0$, etc., of certain amplitudes.

Furthermore, in some embodiments the input termination circuit 200 can be further configured to present controllable impedances to an amplifier device. Specifically, in these embodiments the controllable impedance is variable responsive to the applied control signal 206. Thus, by changing the control signal 206 the controllable impedance presented to the amplifier device can be varied.

In one specific embodiment, the control signal 206 and thus the presented controllable impedance can be adapted to be variable responsive to an input voltage applied to the amplifier device. In other embodiments, the control signal 206 and thus the presented controllable impedance can be adapted to be variable responsive to an input current applied to the amplifier device. In yet another embodiment, the control signal 206 and thus the presented controllable impedance component can be adapted to be variable responsive to the frequency of an input signal applied to the amplifier device 100. To facilitate such embodiments the control signal 206 can be determined by microcontroller, analog control circuit, or other processing device.

Figure 4:
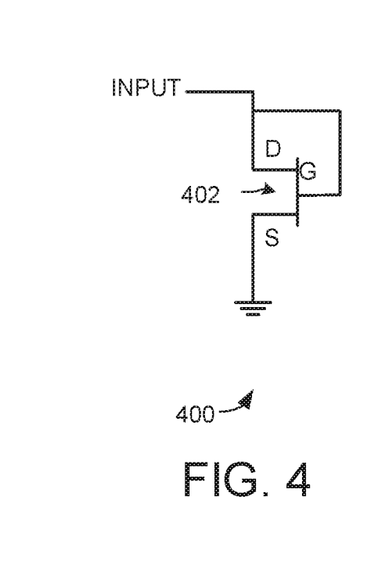
FIG. 4 is a circuit diagram of an exemplary input termination circuit in accordance with an example embodiment.

Turning now to FIG. 4, another embodiment of an input termination circuit 400 is illustrated. The input termination circuit 400 includes an input (e.g., coupled to the output of first input phase shifter 106), and a transistor 402 configured with the gate coupled directly to the drain. When so configured, the transistor 402 will operate as a controllable voltage limiter. Again, transistor 402 as illustrated comprises an n-channel field effect transistor (FET), but that is just one example and other types of transistors can also be used.

Figure 5:
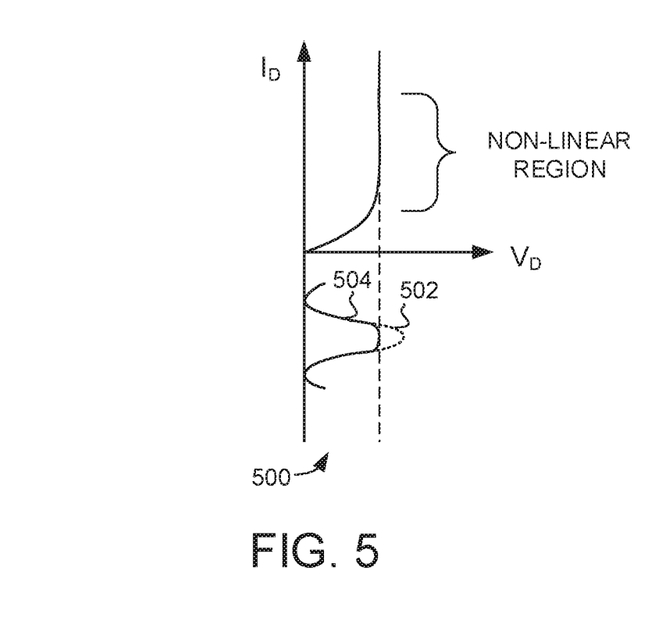
FIG. 5 is a graphical representation of drain-source voltage ($V_D$) and the drain source current ($I_D$) in an exemplary input termination circuit in accordance with an example embodiment.

Turning to FIG. 5, a graph 500 illustrates exemplary relationship between the transistor 402 drain-source voltage ($V_D$) and the drain source current ($I_D$). Again, indicated in graph 500 is non-linear region, where the relationship between voltage and current is non-linear. By coupling the gate of the transistor 402 to the drain, the transistor 402 will operate in the non-linear region, and the transistor 402 will further limit the voltage at the input. Thus, the input termination circuit 400 will present a non-linear impedance to the amplifier device.

Also illustrated in FIG. 5 is an input signal 502. Again, this input signal 502 is exemplary of the type of signal that would be applied to the input termination circuit 400 from the output of the first input phase shifter. When applied to the non-linear impedance presented by the input termination circuit 400, the signal 502 is modified (i.e., is voltage limited) as illustrated in signal 504. This modified signal 504 is reflected back toward the amplifier device, where it can facilitate improved control over the input power distribution in a way that can increase the linearity of the amplifier device.

In one embodiment that will be described in greater detail below, this voltage limiting in the modified signal 504 is equivalent to the generation of a signal at an odd harmonic frequency (e.g., the third harmonic frequency ($3f_o$)).

Figure 6:
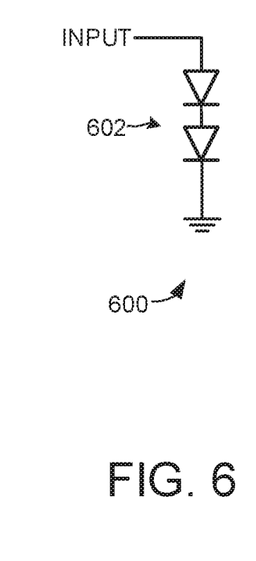
FIG. 6 is a circuit diagram of an exemplary input termination circuit in accordance with an example embodiment.

Turning now to FIG. 6, another embodiment of an input termination circuit 600 is illustrated. The input termination circuit 600 includes an input (e.g., coupled to the output of first input phase shifter 106), and two diodes 602 in series. When so configured, the diodes 602 will also operate as a controllable voltage limiter. Again, such a voltage limiter will generate a modified signal (e.g., modified signal 504), where that modified signal includes odd harmonics of the original signal 502, and that modified signal will be reflected back to the input phase shifter network of the amplifier device.

Figure 7:
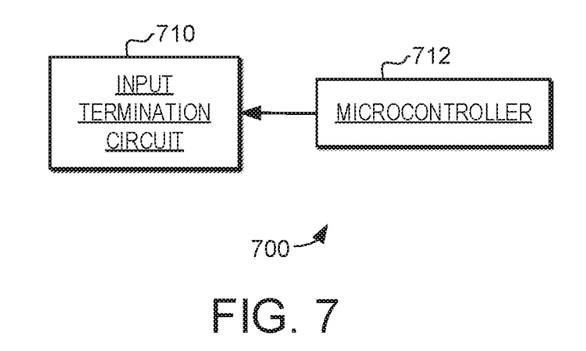
FIG. 7 is a schematic diagram of an exemplary input termination circuit and microcontroller in accordance with an example embodiment.

As noted above, in various embodiments the input termination circuit includes a controllable impedance component coupled to the input of second amplifier 104. In these embodiments, the ratio of generated current to applied voltage at the input termination circuit changes in response to a control signal or other input. Turning now to FIG. 7, an input termination circuit 710 is coupled to a microcontroller 712. In such an embodiment the microcontroller 712 can provide one or more control signals (e.g., control 206, FIG. 2) to control the operation of the input termination circuit 710.

For example, the microcontroller 712 can be configured to receive the amplifier input signal, and can be adapted to generate the control signal responsive to the amplifier input signal. For example, the microcontroller 712 can be configured to generate the control signal responsive to the amplitude of the voltage applied to the amplifier device. In other embodiments the microcontroller 712 can be configured to generate the control signal responsive to the amplitude of the current applied to the amplifier device. Finally, in other embodiments the microcontroller 712 can be configured to generate the control signal responsive to the frequency of the input signal applied to the amplifier device.

To facilitate this, the microcontroller 712 can be implemented with any suitable processing device, including combinations of hardware and software. For example, the microcontroller 712 can be implemented as software implemented programs, and then executed with a processing device that utilizes integrated circuits designed to execute programs stored in a memory. In other embodiments, the microcontroller 712 can be implemented with application-specific integrated circuits (ASICs) designed for particular use cases. Finally, it should be noted that the microcontroller 712 can be implemented on the same chip or die with the amplifier device, or on a separate chip or die. Furthermore, the microcontroller 712 can be packed with the amplifier device, or in a separate package.

In other embodiments, the amplifier input signal can be applied directly to the input termination circuit and used to control the input termination circuit. In these embodiments the input termination circuit itself is made responsive to the input voltage, input current or input signal frequency applied to the amplifier device. In other such implementations analog control circuits maybe used to provide the appropriate control signal that is responsive to the input voltage, input current or input signal frequency applied to the amplifier device.

As was described above, the input termination circuits described above can be applied to a variety of amplifier devices. In one particular embodiment, the input termination circuit can be applied to a Doherty-type amplifier that uses a carrier amplifier and one or more peaking amplifiers coupled in parallel to provide parallel amplification paths. In general, Doherty amplifiers use separate amplifiers to amplify a carrier signal and one or more peaking signals, and are particularly applicable to high power RF applications.

Specifically, in Doherty-type amplifiers the carrier amplifier is used to drive the main body of the signal, and the one or more peaking amplifiers are used to drive the peaks of the signal. Typically, when the input RF signal is at relatively low signal levels, the carrier amplifier operates in a linear AB-class with its compression point near average power level of Doherty amplifier and thus with high efficiency, while the peaking amplifiers remain in an "off state" and exhibit very high impedance at their outputs. Thus, at relatively low signal levels the Doherty amplifier can provide both high efficiency and good linearity. Then, when the carrier amplifier approaches a compression point at around average power level, the peaking amplifiers start to operate and "top up" the resulting output signal while reducing load line value at the output of the carrier amplifier as power level increases. The peaking amplifiers thus provide the ability to achieve high power output during times of high input signal levels. Thus, the types of amplifiers in the Doherty amplifier together can provide relatively high power output and high efficiency maintaining minimal required linearity.

In one example implementation, the carrier amplifier is configured to operate as a class AB amplifier, and the peaking amplifiers are configured to operate as class C amplifiers. For example, a strongly asymmetrical Doherty amplifier combines a relatively small carrier amplifier operating in class AB that provides about 10 percent of the output power with two relatively large peaking amplifiers that provide about 90 percent of the output power. This facilitates high linearity while providing high power efficiency and a larger back-off power range (e.g., between 12 dB and 16 dB) located below peak power level of the Doherty amplifier. Due to the very large back-off power range, the gate DC bias point of two peaking amplifiers may be arranged in the way to provide C-class operation mode with relatively large conduction angle, closer to that used for linear B-class operation mode.

As noted above, in some embodiments the Doherty amplifier can be implemented to include multiple peaking amplifiers. Doherty amplifiers that include multiple peaking amplifiers are commonly referred to as "multi-way" or "N-way" (N>2) Doherty amplifiers. When compared to 2-way Doherty amplifiers, multi-way Doherty amplifiers can provide several advantages. For example, multi-way Doherty amplifiers can provide self-compensation of load line modulation and increased flexibility in size and arrangement. Such advantages are particularly applicable to new generations of mobile communication technology, including 4G and 5G technologies. In these new technologies there is a need to provide higher data rate transmission with less energy consumption to meet Mobile Base Station Transmitters final stage requirements. Additionally, the requirements for higher data rates can lead to larger crest-factor of the transmitted signal, which in turn can require larger power back-off range.

To meet these requirements multi-way Doherty amplifiers can be implemented to provide improved average power efficiency with good linearity and frequency bandwidth. However, some multi-way Doherty power amplifiers can be limited by inconsistent performance parameters in the transistors implementing the amplifier. Furthermore such implementations can require input power distribution corrections specific to particular frequency band and power level to achieve the desired linearity at maximal efficiency.

Thus, to implement such a multi-way Doherty power amplifier it is generally desirable to use peaking amplifiers with phase characteristics, group delay, and amplitude characteristics that are nearly identical over the power and frequency range. Furthermore, such amplifiers can be implemented with AM-PM characteristics selected to provide good linearity versus power level and frequency. Furthermore, to provide a desired back-off power range the multi-way Doherty amplifier can be implemented with relatively large asymmetry between the carrier and peaking amplifiers. For example, the Doherty amplifier can be implemented such that the peaking amplifiers are larger than the carrier amplifiers by a factor of between about 1.5 to about 2.0 times or greater. Such an arrangement can allow for larger back-off power ranges of up to about 9 dB. Furthermore, such an asymmetrical Doherty amplifier can provide a higher modulation rate of load line.

Figure 8:
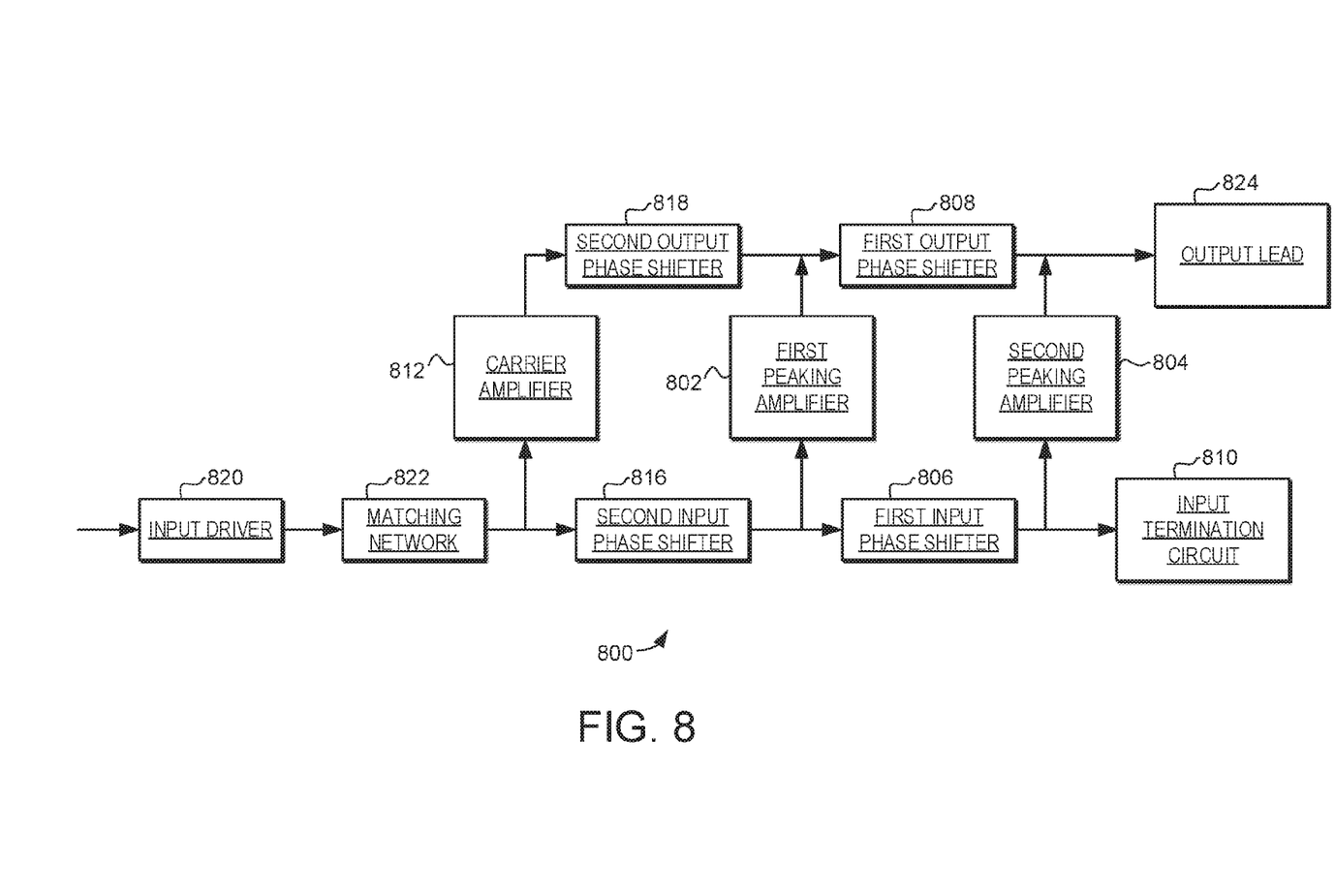
FIG. 8 is a schematic diagram of a portion of an amplifier in accordance with an example embodiment.

Turning now to FIG. 8, a schematic diagram of a portion of an exemplary multi-way Doherty amplifier device 800 is illustrated. The Doherty amplifier device 800 includes an input driver 820, a matching network 822, a carrier amplifier 812, a first peaking amplifier 802, a second peaking amplifier 804, a first input phase shifter 806, a first output phase shifter 808, a second input phase shifter 816, a second output phase shifter 818, and an output lead 824. And in accordance with the embodiments described herein, the Doherty amplifier device 800 also includes an input termination circuit 810. It should be noted that the Doherty amplifier device 800 is again a simplified representation of a portion of an amplifier, and in a more typical implementation the amplifier would include additional features not illustrated in FIG. 8.

During operation of the Doherty amplifier device 800, the input driver 820 and matching network 822 are configured to receive and condition an RF input signal and apply the conditioned RF input signal to the carrier amplifier 812 input, while maximizing power transfer to the carrier amplifier 812 and minimizing signal reflection.

The carrier amplifier 812 can comprise one or more transistors (e.g., including a driver transistor and a final stage transistor). Likewise, the first peaking amplifier 802 and second peaking amplifier 804 can both can comprise one or more other transistors (e.g., including a driver transistor and a final stage transistor). Furthermore, it should be noted that while the Doherty amplifier device 800 includes two peaking amplifiers, that in other embodiments more peaking amplifiers can instead be used.

Finally, it should be noted that in this illustrated example the Doherty amplifier device 800 is implemented as a traveling wave amplifier. In general, traveling wave amplifiers utilize transmission lines or equivalent lumped element circuits to provide phase shifts between the inputs of the carrier and peaking amplifiers 812, 802 and 804, and to provide corresponding phase shifts between the outputs of the amplifiers. Such a configuration can provide relatively wide operational bandwidths.

In this illustrated embodiment, the first input phase shifter 806 and second input phase shifter 816 together function as a transmission line, with characteristic impedances between and independently connecting the inputs of the amplifiers. Likewise, the first output phase shifter 808 and second output phase shifter 818 together function as a transmission line with characteristic impedances between and independently connecting the outputs of the amplifiers. During operation, an RF input signal is received and propagates down the input line and these characteristic impedances introduce the appropriate phase shifts. The individual carrier and peaking amplifiers 812, 802 and 804 respond to the forward traveling input by inducing an amplified complementary forward traveling wave on the output line.

To facilitate this, the first input phase shifter 806, second input phase shifter 816, first output phase shifter 808, and second output phase shifter 818 can each be implemented with a transmission line, or with transmission line equivalent such as lumped or integrated element equivalents. In one embodiment, the first input phase shifter 806, second input phase shifter 816, first output phase shifter 808, and second output phase shifter 818 are each implemented with a specific characteristic impedance configured to provide about a 90 degree phase shift for signals at a fundamental frequency ($f_0$), and provide about a 180 degree phase shift for signals at a second harmonic frequency ($2f_0$) and provide signal rejection for signals at a third harmonic frequency ($3f_0$). When so implemented, this embodiment provides F-class operation mode of peak amplifiers with improved efficiency of Doherty amplifier in the range of power levels above average power level.

As one detailed example, the first output phase shifter 808 can be implemented to have characteristic impedance $Z_{01}$, defined as:

$$Z_{01} = \frac{2V_d}{I_{d\_m} + I_{d\_p1}}. \qquad \text{Equation 1}$$

Likewise, the second output phase shifter 818 can be implemented to have a characteristic impedance $Z_{02}$, defined as:

$$Z_{02} = \frac{2V_d}{I_{d\_m}}. \quad \text{Equation 2}$$

Likewise, the first input phase shifter 806 can be implemented to have a characteristic impedance $Z_{11}$, defined as:

$$Z_{11} = \frac{\alpha_2 Z_o}{K}\sqrt{K + \frac{1}{K}}. \quad \text{Equation 3}$$

Likewise, the second input phase shifter 816 can be implemented to have a characteristic impedance $Z_{12}$, defined as:

$$Z_{12} = \frac{\alpha_1 \alpha_2 Z_o}{K}\sqrt{K + \frac{1}{K}}. \quad \text{Equation 4}$$

Where:

$$K = \sqrt{\frac{W_{g\_peak1} + W_{g\_peak2}}{W_{g\_main}}} \quad \text{Equation 5}$$

$$\alpha_n = \left(1 + \frac{V_{gs\_pn} - V_t}{V_{gs\_Idmax}}\right)^2 \quad \text{Equation 6}$$

$$Z_0 = \frac{Z_{In\_main}}{K} \quad \text{Equation 7}$$

$$Z_{In\_peak} = \frac{Z_o}{K} \quad \text{Equation 8}$$

$$R_{Load} = \frac{2V_d}{I_{d\_m} + I_{d\_p1} + I_{d\_p2}} \quad \text{Equation 9}$$

And where $V_d$ is the DC drain voltage of associated transistors, $I_{d\_m}$ is the peak drain current capability of the carrier amplifier 812, $I_{d\_p1}$ is the peak drain current capability of the first peaking amplifier 802, and $I_{d\_p2}$ is the peak drain current capability of the second peaking amplifier 804, $W_{g\_main}$ is the gate periphery size of the carrier amplifier 812, $W_{g\_peak1}$ is the gate periphery size of the first peaking amplifier 802, $W_{g\_peak2}$ is the gate periphery size of the second peaking amplifier 804, $Z_0$ is the impedance of the input signal source, $Z_{in\_main}$ is input impedance of the carrier amplifier 812, $Z_{in\_peak}$ is the input impedance of the first peaking amplifier 802 and the second peaking amplifier 804, K is the Doherty amplifier asymmetry coefficient, cu is the gate bias coefficient of the first peaking amplifier 802, $\alpha_2$ is the gate bias coefficient of the second peaking amplifier 804, $V_{gs\_p}$ is the DC gate bias of first peaking amplifier 802 and second peaking amplifier 804, $V_t$ is the threshold gate voltage of transistors implementing the first peaking amplifier 802 and second peaking amplifier 804, and $V_{gs\_Idmax}$ is the gate source voltage at maximum drain current of the transistors implementing the first peaking amplifier 802 and second peaking amplifier 804, and where $R_{Load}$ is the load impedance of the amplifier device 800.

It should be noted that in some implementations an absorption method may be used to provide part of needed impedance values $Z_{01}$, $Z_{02}$, $Z_{11}$ and $Z_{12}$. As one example, if lumped elements are used the output parasitic capacitances of transistors in the amplifiers 802 and 804 can be incorporated into the output phase shifters 808 and 818. Specifically, as low-pass prototype of pi-type, the parasitic output or input capacitances ($C_{ds}$ and $C_{gs}$) of field effect transistors can be fully or partially incorporated as shunt capacitances in the output phase shifters 808 and 818. However, depending on operational frequency these parasitic capacitances may be too large, and in those cases the parasitic capacitances can be partially compensated using appropriate parallel shunt inductances or by providing shunt capacitive equivalents with the needed imaginary impedance of the device output. Furthermore, when such a compensation shunt inductance is grounded through a large capacitance a RF cold point can be created, where the RF cold point isolates RF signals and provides a convenient point for application of DC power supply with minimal RF power loss of output signal with wideband bandwidth and up to 600 MHz modulation.

Thus, in accordance with the embodiments described herein, the input termination circuit 810 is configured to reflect a frequency dependent portion of an input signal back toward the amplifier input. Specifically, the input termination circuit 810 is configured to reflect back the frequency dependent portion of the input signal back to the output of the first input phase shifter 806 and the input of the second peaking amplifier 804. As was described above, this input signal reflection can implemented to provide improved control over the input power distribution in a way that can increase the linearity of the Doherty amplifier device 800. Furthermore, such an increase in linearity can be provided to amplifier devices that are used in wideband, high power RF applications.

As was described above, the input termination circuit 810 can be implemented with a variety of circuits, including nonlinear, controllable impedances. Such controllable impedances can be adapted to be variable responsive to input voltages, currents, and frequencies applied to the amplifier device.

In accordance with other embodiments, an asymmetrical input splitter can also be included in the amplifier device. In general, an asymmetrical input splitter can be added to improve the isolation of the amplifiers (e.g., first amplifier 102 and second amplifier 104 of FIG. 1). For example, in Doherty amplifier applications, such an asymmetrical input splitter can improve the isolation between the carrier amplifier and the peaking amplifiers. Such improved isolation can further facilitate improved amplifier linearity, especially when combined with the input termination circuits described above.

In one embodiment, the asymmetrical input splitter includes two phase shifters, with a first coupled to the input of the carrier amplifier, and a second coupled to the input of the first peaking amplifier. Furthermore, in one embodiment, an impedance element is coupled between the carrier amplifier input and first peaking amplifier input. Such an impedance element can be provided to consume a portion of the reflected signal from the input termination circuit.

Figure 9:
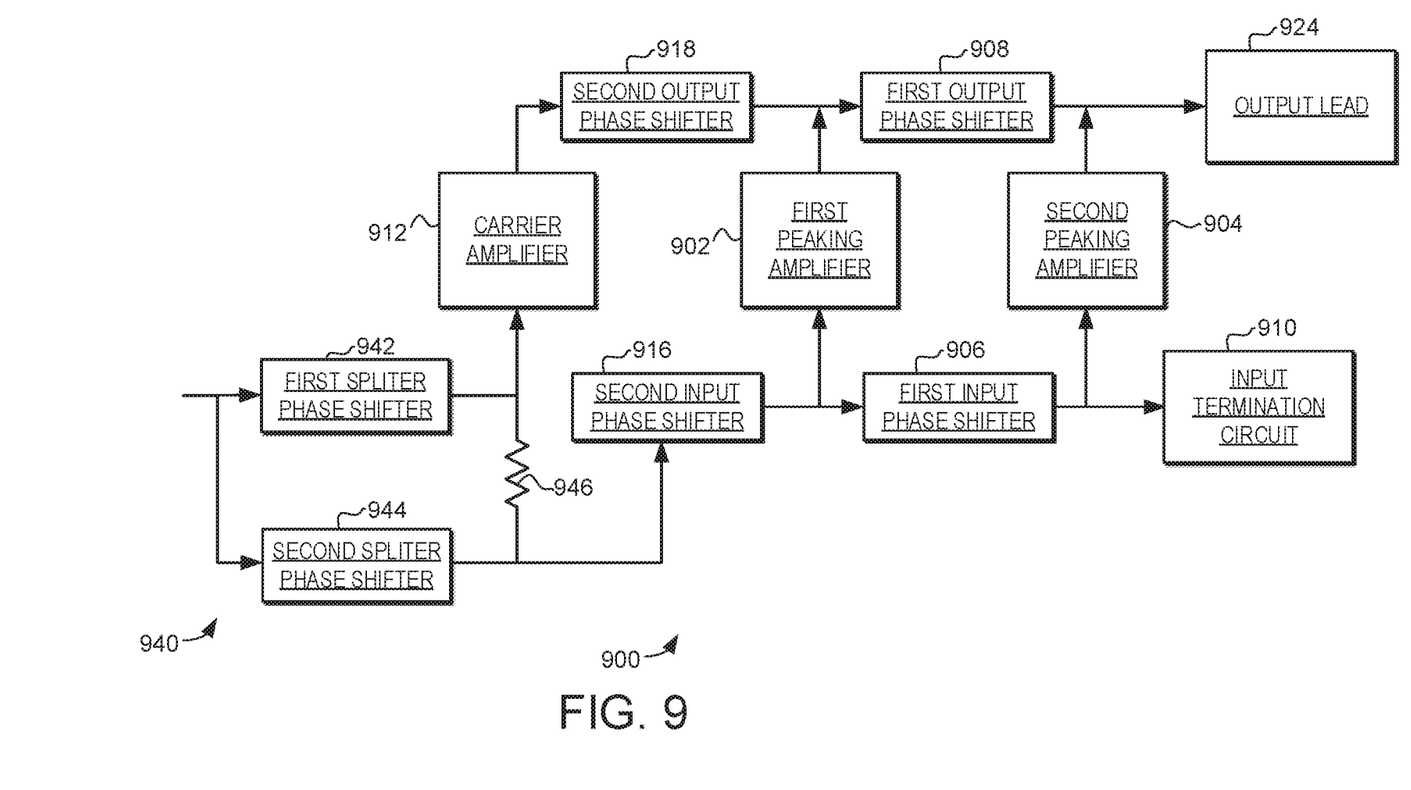
FIG. 9 is a schematic diagram of a portion of an amplifier in accordance with an example embodiment.

Turning now to FIG. 9, a schematic diagram of an exemplary amplifier device 900 is illustrated. The amplifier device 900 is similar to the embodiment illustrated in FIG. 8, with the addition of an asymmetric input splitter 940. Thus, the amplifier device 900 further includes a carrier amplifier 912, a first peaking amplifier 902, a second peaking amplifier 904, a first input phase shifter 906, a first output phase shifter 908, a second input phase shifter 916, a second output phase shifter 918, and an output lead 924. And in accordance with the embodiments described herein, the amplifier device 900 also includes an input termination circuit 910.

The asymmetric input splitter 940 includes a first splitter phase shifter 942, a second splitter phase shifter 944, and a resistor 946. The first splitter phase shifter 942 receives an input signal and is coupled to the input of the carrier amplifier 912. The second splitter phase shifter 944 receives the input signal and is coupled to the input of the second input phase shifter 916.

The asymmetric input splitter 940 can be considered a type of Wilkinson splitter. As such, the first splitter phase shifter 942 and second splitter phase shifter 944 are implemented to provide desired phase shifts between the input of the amplifier device 900 and the carrier amplifier 912 and first peaking amplifier 902. To facilitate this, the first splitter phase shifter 942 and second splitter phase shifter 944 can be implemented with transmission lines or equivalent lumped element circuits to provide characteristic impedances between the inputs of the carrier amplifier 912 and first peaking amplifier 902. During operation, an input signal propagates down the first splitter phase shifter 942 and second splitter phase shifter 944 and the characteristic impedances introduced by those elements introduce appropriate phase shifts.

During operation, the resistor 946 provides isolation and balancing between the outputs of the first splitter phase shifter 942 and the second splitter phase shifter 944. Specifically, the resistor 946 consumes the reflected signal that would otherwise come back to carrier amplifier 912. Furthermore, the resistor 946 provides balancing in the frequency band to make a flat frequency response between carrier amplifier 912, first peaking amplifier 902 and second peaking amplifier 904. Furthermore, it should be noted that while FIG. 9 illustrates only a resistor 946 coupled between the outputs of the first splitter phase shifter 942 and the second splitter phase shifter 944, while other embodiments can include other impedance elements. For example, various combinations of resistive elements, inductances, and capacitances can be coupled in series and/or parallel between the outputs of the first splitter phase shifter 942 and the second splitter phase shifter 944 to tailor required frequency response of isolation vs power split if required.

The asymmetric input splitter 940 can thus absorb reflection from the input termination circuit 910, including harmonics that would otherwise distort amplifier operation and increase non-linearity. Furthermore, this improves the isolation of the carrier amplifier 912. Stated another way, the input termination circuit 910 can improve control over the power distribution between the first peaking amplifier 902 and the second peaking amplifier 904. Likewise, the asymmetric input splitter 940 can improve the isolation of the carrier amplifier 912. Taken together, the linearity of the amplifier device 900 can be improved while maintaining a wide bandwidth. Finally, the asymmetric input splitter 940 can be implemented in a compact space.

As one detailed example, the characteristic impedances of the first input phase shifter 906, first output phase shifter 908, second input phase shifter 916 and second output phase shifter 918 can be defined according to the corresponding Equations 1, 2, 3 and 4 defined above. Furthermore, the first splitter phase shifter 942 can be implemented to have characteristic impedance $Z_{11}$, defined as:

$$Z_{11} = KZo\sqrt{K + \frac{1}{K}}$$

Likewise, the second splitter phase shifter 944 can be implemented to have characteristic impedance $Z_{22}$, defined as:

$$Z_{22} = \frac{\alpha_1 \alpha_2 Zo}{K}\sqrt{K + \frac{1}{K}}$$

It should be noted that in the various embodiments described above, the amplifiers (including carrier amplifiers 812 and 912 and peaking amplifiers 802, 902, 804, 904) can be implemented with suitable RF-capable transistors with relatively high power capability. For example, these amplifiers can be implemented with Gallium Nitride (GaN) transistors or laterally diffused metal oxide semiconductor (LD-MOS) transistors, as well as with other device technology types.

Furthermore, as used herein, the term transmission line is defined as a conductive line or other conductive element that has a specific characteristic impedance and effective electrical length for specific RF frequency transmissions. Thus, when implemented with transmission lines, the various phase shifters described above (e.g., phase shifters 106, 108, 806, 808, 816, 818) can be implemented with various types of transmission lines or combined with lumped elements to provide a compact solution with better flexibility of network electrical and RF properties. For example, the transmission lines can be implemented as one distributed and more lumped components within an integrated passive device (IPD). In general, IPDs are formed using wafer-level or die-level fabrication techniques such as photolithography. Thus, in such an example, transmission lines can be formed on a wafer by depositing and patterning a conductive material to have the selected length, width, dielectric thickness and other desirable features in 3-dimensional multi-layer environment.

As a more particular example, transmission lines can be implemented with an asymmetrical micro-strip line. In general, a micro-strip line is a type of transmission line that includes a conductive strip that is separated from a ground plane by a dielectric layer. Micro-strip lines can be formed on a variety of substrates, including PCB substrates and semiconductor wafer/die substrates, and with a variety of manufacturing techniques. In any of these embodiments, the micro-strip line is formed with a length and width selected to provide a portion of an impedance inverter between the transistor outputs where interconnect bond-wires may be used too. In such an example, each of the transmission lines can be formed as a micro-strip line of the selected length, and then placed in the package with other elements of the amplifier.

Finally, it should be noted that the various amplifier devices described above can be implemented as packaged semiconductor devices. Specifically, the amplifier devices can be formed on semiconductor wafers, singulated into dies, and mounted in packages. As used herein, the term "package" means a collection of structural components (e.g., including a flange or substrate) to which the primary electrical components (e.g., input and output leads, amplifiers and various electrical interconnections) are coupled, where a "package" is a distinct device that may be coupled (e.g., pressed, mounted, attached by adhesive or soldered) to a printed circuit board (PCB) or other substrate that includes other portions of the amplifier. The package substrate or flange may also provide an electrical ground reference for the amplifier devices and associated components. The package may also include an isolator that electrically isolates the package substrate or flange from the leads or alternatively may include encapsulation that provides such electrical isolation. As examples, the package may be an air-cavity package or an overmolded (encapsulated) package such as a quad flat no-leads package (QFN).

It should be noted that in such embodiments the input termination circuit (e.g., input termination circuits 110, 710, 810, 910) can be mounted in the same package as the associated amplifier device (100, 800, 900). For example, the input termination circuit can be formed on the same semiconductor die as the amplifier device or on separate die. However, in other embodiments the input termination circuit could be mounted in a separate package, and a connection between amplifier device and input termination circuit made through package leads on both packages.

Figure 10:
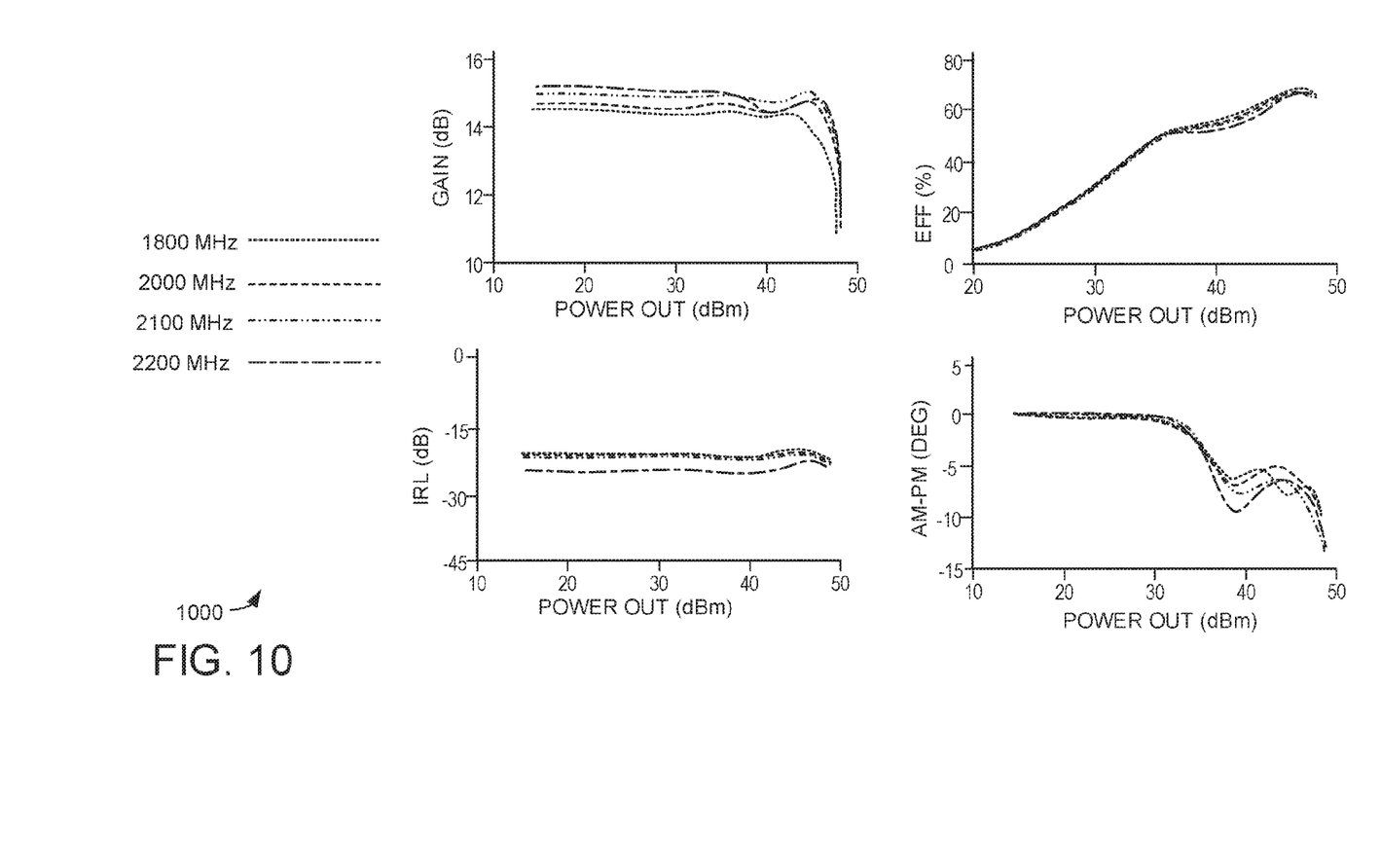
FIG. 10 are graphs of performance parameters for a three-way Doherty amplifier in accordance with an example embodiment.

Turning now to FIG. 10, graphs 1000 illustrate simulated plots of four performance parameters for an amplifier device in accordance with the embodiments described herein. In particular, the graphs 1000 illustrate the gain, efficiency (EFF), input return loss (IRL) and amplitude modulation—phase modulation (AM-PM) versus output power level for an exemplary 3-way asymmetrical Doherty amplifier at frequencies of 1800, 2000, 2100, and 2200 megahertz (MHz). These graphs 1000 demonstrate a good flat frequency response for each of the important parameters, as a function of output power. Stated another way, each of these parameters is highly uniform over the frequency range of interest and thus the amplifier device can provide minimal frequency dispersion.

Figure 11:
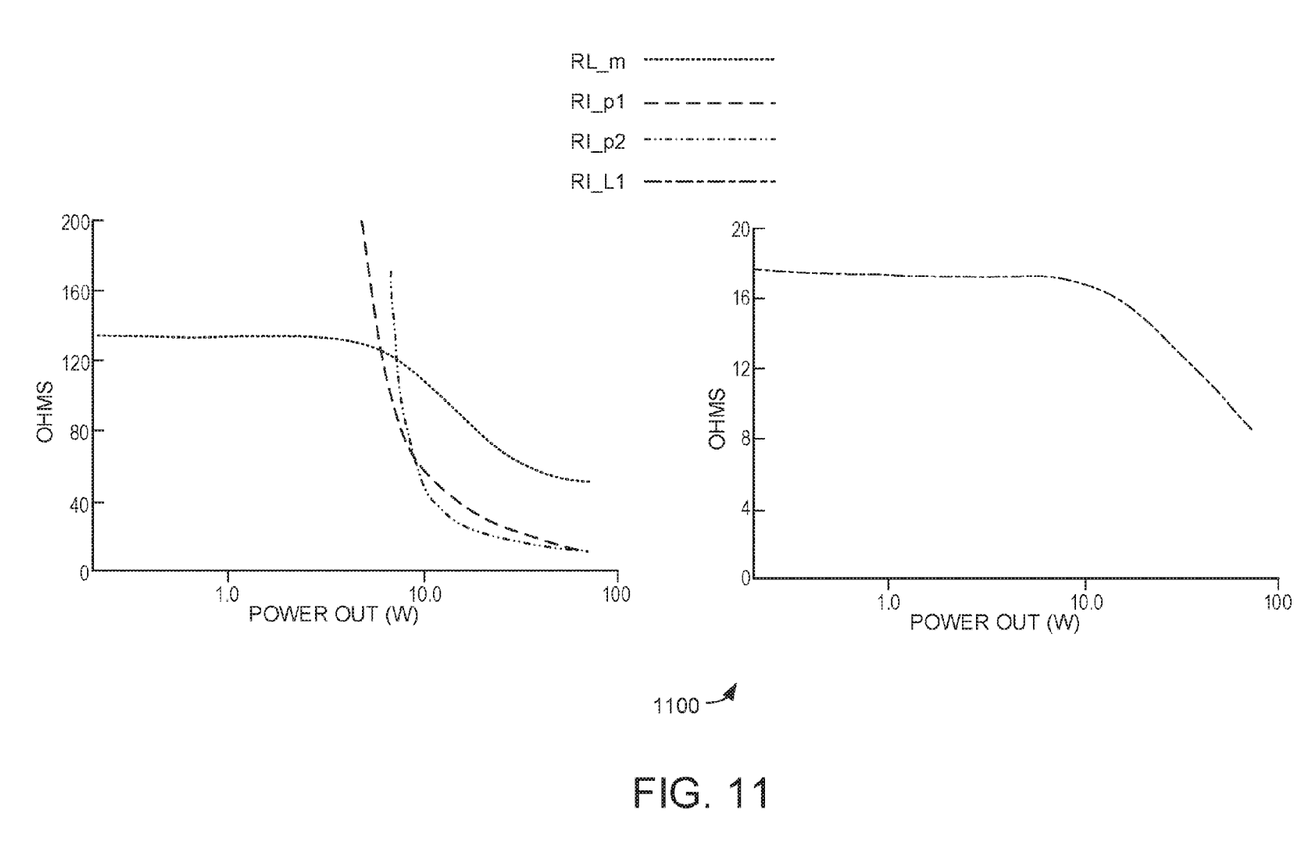
FIG. 11 are graphs of load impedances for a three-way Doherty amplifier in accordance with an example embodiment.

Turning now to FIG. 11, graphs 1100 illustrate various simulated load impedances seen by the output of an amplifier device in accordance with the embodiments described herein, with the load impedances illustrated as a function of output power level. Specifically, graphs 1100 illustrate variable power dependent terminations seen by a carrier amplifier output (labeled RL_m). Graphs 1100 also illustrate variable power dependent terminations seen by the second impedance inverter at a connection point to the first peaking amplifier output (labeled RI_L1), and the variable power dependent terminations seen by the first peaking amplifier output (labeled RI_p1) and the second peaking amplifier output (labeled RI_p2). It can be seen in graphs 1100 that the relative variation of terminations and load impedances seen by carrier amplifier output are relatively low, thus providing a low level of mismatch at far back-off power levels. This facilitates wideband operation with minimal group delay variation. This small variation of group delay allows for minimal distortions of AM-PM characteristic at average power levels. As was illustrated in FIG. 10, an asymmetrical 3-way Doherty device with an input termination circuit can provide up to 12 dB of back-off power range with low AM-PM dispersion and 5 degree ripple over 20 percent operational bandwidth.

Various modifications may be made to the above-described and illustrated embodiments without departing from the scope of the inventive subject matter. For example, although conventional Doherty amplifier implementations are discussed above (e.g., in which a 90 degree phase delay is applied to the input peaking signal prior to amplification, and a corresponding 90 degree phase delay is applied to the output carrier signal after amplification to ensure that the amplified carrier and peaking signals are combined in phase), other embodiments may include an "inverted" Doherty amplifier implementation (e.g., in which a 90 degree phase delay is applied to the input carrier signal prior to amplification, and a corresponding 90 degree phase delay is applied to the output peaking signal after amplification). Further, as mentioned above, embodiments include single-stage and multiple-stage amplifiers. Also, the main and peaking transistors may be implemented on separate die or on the same die, in various embodiments.

In one embodiment, an amplifier device is provided, comprising: a first amplifier, the first amplifier including a first amplifier input and a first amplifier output; a second amplifier, the second amplifier including a second amplifier input and a second amplifier output; a first input phase shifter of specific characteristic impedance coupled between the first amplifier input and the second amplifier input; a first output phase shifter of specific characteristic impedance coupled between the first amplifier output and the second amplifier output; and an input termination circuit coupled to the second amplifier input, the input termination circuit configured to reflect a frequency dependent portion of an input signal back toward the first amplifier input.

According to an example, the input termination circuit comprises a constant impedance component coupled to the second amplifier input.

According to an example, the input termination circuit comprises a non-linear impedance component coupled to the second amplifier input.

According to an example, the non-linear impedance component is variable dependent upon at least one of a voltage or current applied to the non-linear impedance component.

According to an example, the non-linear impedance component is implemented with one or more components selected from a transistor configured to operate in a non-linear VI region, one or more diodes, a varactor, a varistor, a Hall sensor, and a metal oxide semiconductor capacitor.

According to an example, the input termination circuit comprises a controllable impedance component coupled to the second amplifier input. The controllable impedance component is adapted to be variable responsive to a characteristic selected from an input voltage applied to the amplifier device, an input current applied to the amplifier device, and a frequency of an input signal applied to the amplifier device.

According to an example, the input termination circuit comprises a controllable impedance component. The controllable impedance component is implemented with a controllable voltage limiter coupled to the second amplifier input.

According to an example, the input termination circuit is controllable via a microcontroller.

According to an example, the first input phase shifter is selected from a transmission line and a lumped element circuit configured to provide a transmission line equivalence.

According to an example, the amplifier device further comprises a carrier amplifier, the carrier amplifier including a carrier amplifier input and a carrier amplifier output; a second input phase shifter of specific characteristic impedance coupled between the carrier amplifier input and the first amplifier input; and a second output phase shifter of specific characteristic impedance coupled between the carrier amplifier output and the first amplifier output.

According to an example, the amplifier device further comprises an asymmetrical input splitter. The asymmetrical input splitter has an input, a first output, and a second output. The input is coupled to an RF signal source. The first output is coupled to the carrier amplifier input. The second output is coupled to the second input phase shifter.

According to an example, the amplifier device further comprises at least one of a resistive element, inductance and capacitance coupled between the first output and the second output.

According to an example, the asymmetrical input splitter comprises a Wilkinson power splitter.

In another embodiment, a Doherty amplifier device is provided, comprising: a carrier amplifier, the carrier amplifier including a carrier amplifier input and a carrier amplifier output; a first peaking amplifier, the first peaking amplifier including a first peaking amplifier input and a first peaking amplifier output; a second peaking amplifier, the second peaking amplifier including a second peaking amplifier input and a second peaking amplifier output; a first input phase shifter coupled between the first peaking amplifier input and the second peaking amplifier input; a second input phase shifter coupled between the carrier amplifier input and the first peaking amplifier input; a first output phase shifter coupled between the first peaking amplifier output and the second peaking amplifier output; a second output phase shifter coupled between the carrier amplifier output and the first peaking amplifier output; and an input termination circuit coupled to the second peaking amplifier input, the input termination circuit configured to reflect a portion of an input signal back toward first peaking amplifier input.

According to an example, the first input phase shifter has a specific characteristic impedance configured to provide a 90 degree phase shift for signals at a fundamental frequency ($f_0$) and provide a 180 degree phase shift for signals at a second harmonic frequency ($2f_0$) and provide signal rejection for signals at a third harmonic frequency ($3f_0$).

According to an example, the input termination circuit comprises a controllable impedance component coupled to the second amplifier input. The controllable impedance component is adapted to be variable responsive to at least one of an input voltage amplitude applied to the amplifier device, an input current amplitude applied to the amplifier device, and a frequency of an input signal applied to the amplifier device.

According to an example, the controllable impedance component is implemented with transistor having a gate, a drain and a source, the drain coupled to the second amplifier input. The source is coupled to a reference voltage.

According to an example, the gate of the transistor is coupled to a microcontroller to facilitate control of the transistor and provide the controllable impedance component.

According to an example, the input termination circuit is implemented with a transistor configured to operate in a non-linear VI region to provide a non-linear impedance component.

According to an example, the Doherty amplifier device further comprises an asymmetrical input splitter. The asymmetrical input splitter has an input, a first output, and a second output. The input is coupled to an RF signal source. The first output is coupled to the carrier amplifier input. The second output is coupled to the second input phase shifter. The asymmetrical input splitter further comprises a resistive element coupled between the first output and the second output.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. An amplifier device comprising:
   a first amplifier, the first amplifier including a first amplifier input and a first amplifier output;
   a second amplifier, the second amplifier including a second amplifier input and a second amplifier output;
   a first input phase shifter of specific characteristic impedance coupled between the first amplifier input and the second amplifier input;
   a first output phase shifter of specific characteristic impedance coupled between the first amplifier output and the second amplifier output; and
   an input termination circuit coupled to the second amplifier input, the input termination circuit configured to reflect a frequency dependent portion of an input signal back toward the first amplifier input, wherein the input termination circuit comprises a non-linear impedance component implemented with one or more components selected from a transistor configured to operate in a non-linear VI region, one or more diodes, a varactor, a varistor, a Hall sensor, and a metal oxide semiconductor capacitor.

2. The amplifier device of claim 1, wherein the non-linear impedance component is variable dependent upon at least one of a voltage or current applied to the non-linear impedance component.

3. An amplifier device comprising:
a first amplifier, the first amplifier including a first amplifier input and a first amplifier output;
a second amplifier, the second amplifier including a second amplifier input and a second amplifier output;
a first input phase shifter of specific characteristic impedance coupled between the first amplifier input and the second amplifier input;
a first output phase shifter of specific characteristic impedance coupled between the first amplifier output and the second amplifier output; and
an input termination circuit coupled to the second amplifier input, the input termination circuit configured to reflect a frequency dependent portion of an input signal back toward the first amplifier input, wherein the input termination circuit comprises a controllable impedance component coupled to the second amplifier input, where the controllable impedance component is adapted to be variable responsive to a characteristic selected from an input voltage applied to the amplifier device, an input current applied to the amplifier device, and a frequency of an input signal applied to the amplifier device.

4. The amplifier device of claim 3, wherein the controllable impedance component is implemented with a controllable voltage limiter coupled to the second amplifier input.

5. The amplifier device of claim 3, wherein the input termination circuit is controllable via a microcontroller.

6. The amplifier device of claim 1, wherein the first input phase shifter is selected from a transmission line and a lumped element circuit configured to provide a transmission line equivalence.

7. An amplifier device comprising:
a first amplifier, the first amplifier including a first amplifier input and a first amplifier output;
a second amplifier, the second amplifier including a second amplifier input and a second amplifier output;
a first input phase shifter of specific characteristic impedance coupled between the first amplifier input and the second amplifier input;
a first output phase shifter of specific characteristic impedance coupled between the first amplifier output and the second amplifier output;
an input termination circuit coupled to the second amplifier input, the input termination circuit configured to reflect a frequency dependent portion of an input signal back toward the first amplifier input;
a carrier amplifier, the carrier amplifier including a carrier amplifier input and a carrier amplifier output;
a second input phase shifter of specific characteristic impedance coupled between the carrier amplifier input and the first amplifier input; and
a second output phase shifter of specific characteristic impedance coupled between the carrier amplifier output and the first amplifier output.

8. The amplifier device of claim 7, further comprising:
an asymmetrical input splitter, the asymmetrical input splitter having an input, a first output, and a second output, the input coupled to an RF signal source, the first output coupled to the carrier amplifier input, and the second output coupled to the second input phase shifter.

9. The amplifier device of claim 8, further comprising at least one of a resistive element, inductance and capacitance coupled between the first output and the second output.

10. The amplifier device of claim 8, wherein the asymmetrical input splitter comprises a Wilkinson power splitter.

* * * * *